United States Patent
Park et al.

(10) Patent No.: US 7,450,033 B2
(45) Date of Patent: Nov. 11, 2008

(54) APPARATUS AND METHOD FOR RECEIVING SIGNAL IN A COMMUNICATION SYSTEM

(75) Inventors: Sung-Eun Park, Seoul (KR); Dong-Seek Park, Yongin-si (KR); Jae-Yoel Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/709,907

(22) Filed: Feb. 22, 2007

(65) Prior Publication Data

US 2007/0210941 A1    Sep. 13, 2007

(30) Foreign Application Priority Data

Feb. 22, 2006   (KR) ............... 10-2006-0017365

(51) Int. Cl.
*H03M 7/00* (2006.01)

(52) U.S. Cl. ........................... 341/51; 714/800

(58) Field of Classification Search ............... 341/50, 341/51; 714/752, 758, 704, 800, 801; 455/69
See application file for complete search history.

(56) References Cited

U.S. PATENT DOCUMENTS

| | | | | |
|---|---|---|---|---|
| 6,850,639 | B2* | 2/2005 | Song et al. ............... | 382/162 |
| 7,295,645 | B1* | 11/2007 | El-Ghoroury et al. ....... | 375/345 |
| 7,325,174 | B2* | 1/2008 | Choi et al. ............... | 714/704 |
| 2005/0010846 | A1* | 1/2005 | Kikuchi et al. ............ | 714/752 |
| 2006/0135080 | A1* | 6/2006 | Khandekar et al. ......... | 455/69 |
| 2006/0242536 | A1* | 10/2006 | Yokokawa et al. .......... | 714/758 |

* cited by examiner

*Primary Examiner*—Peguy JeanPierre
(74) *Attorney, Agent, or Firm*—The Farrell Law Firm, PC

(57) ABSTRACT

An apparatus and method for receiving a signal in a signal reception apparatus of a communication system is provided. The signal reception method includes receiving a signal, and decoding the received signal using a Low Density Parity Check (LDPC) decoding scheme according to the number of quantization bits.

10 Claims, 4 Drawing Sheets

APPARATUS AND METHOD FOR RECEIVING SIGNAL IN A COMMUNICATION SYSTEM

PRIORITY

This application claims the benefit under 35 U.S.C. § 119(a) of a Korean Patent Application filed in the Korean Intellectual Property Office on Feb. 22, 2006 and assigned Serial No. 2006-17365, the disclosure of which is incorporated herein by reference.

BACKGROUND OF THE INVENTION

1. Field of the Invention

The present invention relates generally to an apparatus and method for receiving signals in a communication system, and in particular, to an apparatus and method for receiving signals using a different quantization scheme according to the number of quantization bits in a communication system using a Low Density Parity Check (LDPC) code.

2. Description of the Related Art

The next generation communication system has evolved into a packet service communication system, which is a system for transmitting burst packet data to a plurality of mobile stations (MSs) and is suitable for high-capacity data transmission. It is also known that the next generation communication system, together with a turbo code as a channel code, has high performance gain during high-speed data transmission, and the system actively considers using the LDPC code that can increase data transmission reliability by efficiently correcting errors caused by noises generated in a transmission channel. The next generation communication systems that are actively considering the use of the LDPC code include an Institute of Electrical and Electronics Engineers (IEEE) 802.16e communication system and an IEEE 802.11n communication system.

FIG. 1 is a schematic diagram illustrating a structure of a signal transmission apparatus in a general communication system using an LDPC code.

Referring to FIG. 1, the signal transmission apparatus includes an encoder 111, a modulator 113, and a transmitter 115. If an information vector s that the signal transmission apparatus intends to transmit is generated, the information vector s is delivered to the encoder 111. The encoder 111 encodes the information vector s into a codeword vector c, i.e. LDPC codeword, using a predetermined coding scheme, and outputs the codeword vector c to the modulator 113. Herein, the coding scheme can be an LDPC coding scheme. The modulator 113 modulates the codeword vector c into a modulation vector m using a predetermined modulation scheme, and outputs the modulation vector m to the transmitter 115. The transmitter 115 performs transmission signal processing on the modulation vector m output from the modulator 113, and transmits the resulting signal to a signal reception apparatus via an antenna ANT.

FIG. 2 is a schematic diagram illustrating a structure of a signal reception apparatus in a general communication system using an LDPC code.

Here, the signal reception apparatus includes a receiver 211, a demodulator 213, and a decoder 215. A signal transmitted by a signal transmission apparatus is received at the signal reception apparatus via an antenna ANT, and the received signal is delivered to the receiver 211. The receiver 211 then performs signal reception processing on the received signal, and outputs the reception-processed received vector r to the demodulator 213. The demodulator 213 demodulates the received vector r output from the receiver 211 into a demodulation vector x using a demodulation scheme corresponding to the modulation scheme used in the modulator 113 of the signal transmission apparatus, and outputs the demodulation vector x to the decoder 215. The decoder 215 decodes the demodulation vector x output from the demodulator 213 using a decoding scheme corresponding to the coding scheme used in the encoder 111 of the signal transmission apparatus, and finally outputs the decoded signal as a restored information vector $\hat{s}$.

The LDPC code is defined by a parity check matrix in which major elements have a value of 0 and minor elements, other than the elements having a value of 0 have a non-zero value, for example, have a value of 1. The LDPC code can be expressed with a bipartite graph, and the bipartite graph is expressed with variable nodes, check nodes, and edges for connecting the variable nodes to the check nodes.

The LDPC code can be decoded using an iterative decoding algorithm based on the sum-product algorithm in the bipartite graph. The sum-product algorithm is a kind of a message passing algorithm, which is an algorithm that exchanges messages through edges in the bipartite graph and updates the messages by calculating output messages from the messages input to the variable nodes or the check nodes. Therefore, a decoder for decoding the LDPC code, because it uses an iterative decoding algorithm based on the sum-product algorithm, has lower complexity than that of a decoder for the turbo code and can be easily implemented with a parallel processing decoder.

A probability mass function for a binary random variable can be expressed in a Log Likelihood Ratio (LLR) as shown in Equation (1):

$$\log \frac{p_0}{p_1} \quad (1)$$

where $p_0$ denotes probability that a bit value will be 0, and $p_1$ denotes probability that a bit value will be 1.

When iterative decoding is performed on the LLR input shown in Equation (1) in the bipartite graph using the sum-product algorithm, a message update rule during $i^{th}$ iteration (i.e. $i^{th}$ iterative decoding) is as follows:

Message Update Rule during $i^{th}$ Iteration (1) Initialization $$E_{n,m}^{(0)} = 0$$

(2) Variable Node Update Rule $$T_{n,m}^{(i)} = I_n + \sum_{m' \in M(n) \backslash m} E_{n,m'}^{(i-1)}$$

(3) Check Node Update Rule $$E_{n,m}^{(i)} = \prod_{n' \in N(m) \backslash n} \text{sign}\left(T_{n',m}^{(i)}\right) \times f^{-1}\left[\sum_{n' \in N(m) \backslash n} f\left(\left|T_{n',m}^{(i)}\right|\right)\right]$$

-continued (4) Final Node Update Rule $$T_n = I_n + \sum_{m \in M(n)} E_{n,m}^{(i-1)}$$

In the 'message update rule during $i^{th}$ iteration', $T_{n,m}^{(i)}$ denotes a message delivered from an $n^{th}$ variable node to an $m^{th}$ check node during $i^{th}$ iteration, $E_{n,m}^{(i)}$ denotes a message delivered from an $m^{th}$ check node to an $n^{th}$ variable node during $i^{th}$ iteration, $I_n$ denotes an LLR of a channel received at an $n^{th}$ variable node, $M(n)$ denotes a set of all check nodes connected to an $n^{th}$ variable node, $M(n)\backslash m$ denotes a set excluding an $m^{th}$ check node from $M(n)$, $N(m)$ denotes a set of all variable nodes connected to an $m^{th}$ check node, and $N(m)\backslash n$ denotes a set excluding an $n^{th}$ variable node from $N(m)$. In addition, $\text{sign}(x)$ denotes a function indicating a sign of 'x', and this function has a value of 1 for x='positive number' and a value of −1 for x='negative number'.

In the 'message update rule during $i^{th}$ iteration', the check node update rule is expressed as a product of a sign and a magnitude, where the sign is denoted by $$\prod_{n' \in N(m)\backslash n} \text{sign}(T_{n',m}^{(i)})$$

and the magnitude is denoted by $$f^{-1}\left[\sum_{n' \in N(m)\backslash n} f(|T_{n',m}^{(i)}|)\right].$$

In addition, the function $f(x)$ can be expressed as Equation (2):

$$f(x) = -\ln\left(\tanh\left(\frac{x}{2}\right)\right) = \ln\frac{e^x + 1}{e^x - 1} \quad (2)$$

In Equation (2), a relationship of $f^{-1}(x)=f(x)$ is satisfied.

In order to actually implement a decoder for decoding the LDPC code with digital hardware, all messages which are input and output to/from the decoder should be expressed with quantized values. Therefore, the decoder includes a quantizer for quantizing the messages, a check node processor for performing message processing at a check node, and a variable node processor for performing message processing at a variable node. The quantizer can quantize messages using either a uniform quantization scheme or a non-uniform quantization scheme. A quantizer that quantizes messages using the uniform quantization scheme will be referred to as a "uniform quantizer," and a quantizer that quantizes messages using the non-uniform quantization scheme will be referred to as a "non-uniform quantizer." In addition, when the messages are quantized, an interval of the quantization will be referred to as "quantization interval." Therefore, the uniform quantizer quantizes messages at uniform quantization intervals, and the non-uniform quantizer quantizes messages at non-uniform quantization intervals.

As described above, the decoder includes a quantizer, a check node processor, and a variable node processor. The quantizer is implemented with a uniform quantizer or a non-uniform quantizer according to a quantization scheme determined by the decoder to use. The check node processor and the variable node processor are implemented and are to be optimized for the quantizer. For example, if the quantizer is a uniform quantizer, the check node processor and the variable node processor are implemented and are to be optimized for the uniform quantizer, and if the quantizer is a non-uniform quantizer, the check node processor and the variable node processor are implemented and are to be optimized for the non-uniform quantizer.

However, the decoder generally includes only one quantizer. That is, the decoder includes only a selected one of the uniform quantizer and the non-uniform quantizer, and includes a check node processor and a variable node processor optimized for the included quantizer. The decoder cannot decode an LDPC code using a different quantization scheme according to the number of quantization bits, because it is implemented in such a way of determining any one quantization scheme as its quantization scheme and then optimizing a check node processor and a variable node processor for the determined quantizer.

SUMMARY OF THE INVENTION

An aspect of the present invention is to address at least the problems and/or disadvantages and to provide at least the advantages described below. Accordingly, one aspect of the present invention is to provide an apparatus and method for receiving signals in a communication system using an LDPC code.

Another aspect of the present invention is to provide an apparatus and method for receiving signals using a different quantization scheme according to the number of quantization bits in a communication system using an LDPC code.

According to another aspect of the present invention, there is provided an apparatus for receiving a signal in a communication system. The signal reception apparatus includes a receiver for receiving a signal; and a decoder for decoding the received signal using a Low Density Parity Check (LDPC) decoding scheme according to the number of quantization bits.

According to another aspect of the present invention, there is provided a method for receiving a signal in a signal reception apparatus of a communication system. The signal reception method includes receiving a signal; and decoding the received signal using a Low Density Parity Check (LDPC) decoding scheme according to the number of quantization bits.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

Figure 1:
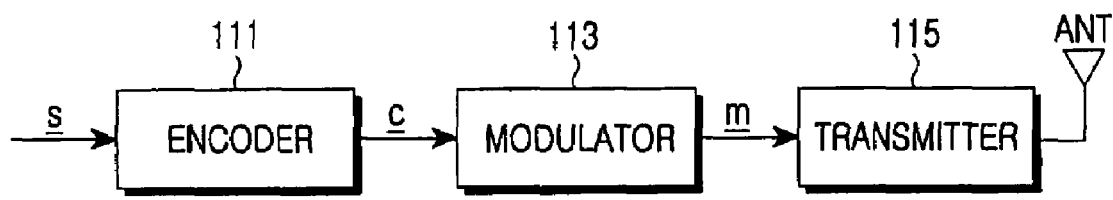
FIG. 1 is a schematic diagram illustrating a structure of a signal transmission apparatus in a general communication system using an LDPC code.
Figure 2:
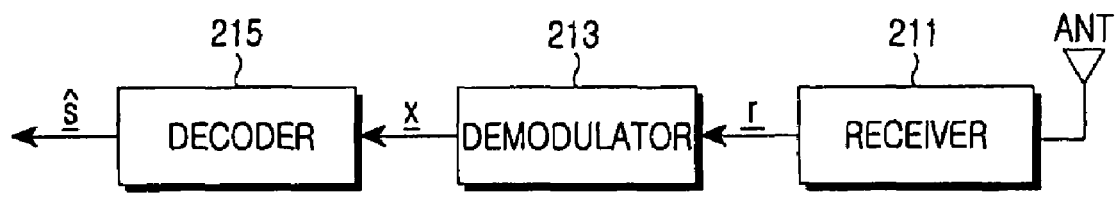
FIG. 2 is a schematic diagram illustrating a structure of a signal reception apparatus in a general communication system using an LDPC code.

The present invention provides an apparatus and method for receiving signals in a communication system using a Low Density Parity Check (LDPC) code. In addition, the present invention provides a signal reception apparatus and method for differentiating its quantization scheme when decoding an LDPC code using an iterative decoding algorithm based on a message passing algorithm, which is a sum-product algorithm, in a communication system using an LDPC code. Although not separately described herein, the inventive operation of decoding an LDPC code using the iterative decoding algorithm based on the message passing algorithm can be applied to the structure of the signal reception apparatus in the communication system, as shown in FIG. 2.

In order to actually implement a decoder for decoding the LDPC code with digital hardware, all messages which are input and output to/from the decoder should be expressed with quantized values. Therefore, the decoder includes a quantizer for quantizing the messages, a check node processor for performing message processing at a check node, and a variable node processor for performing message processing at a variable node. The quantizer can quantize messages using either a uniform quantization scheme or a non-uniform quantization scheme. A quantizer that quantizes messages using the uniform quantization scheme will be referred to as a "uniform quantizer," and a quantizer that quantizes messages using the non-uniform quantization scheme will be referred to as a "non-uniform quantizer." In addition, when the messages are quantized, an interval of the quantization will be referred to as "quantization interval." Therefore, the uniform quantizer quantizes messages at uniform quantization intervals, and the non-uniform quantizer quantizes messages at non-uniform quantization intervals.

Assuming that the uniform quantizer quantizes messages at uniform quantization intervals of $\delta$, each of the quantized messages is expressed with an integer m, and this can be indicated with $\delta m$ which is a Log Likelihood Ratio (LLR). If a function obtained by quantizing the function f(x) shown in Equation (2) is defined as $f(\delta x)$, the function $f(\delta x)$ can be developed in MacLaurin Series as shown in Equation (3):

$$f(\delta x) = \sum_{k=1}^{\infty} \frac{2}{2k-1} e^{-(2k-1)\delta x} \qquad (3)$$

If the function $f(\delta x)$ developed in MacLaurin Series shown in Equation (3) is approximated by omitting terms other than the first term, the approximated function can be expressed as Equation (4):

$$f(\delta x) \cong 2e^{-\delta x} \qquad (4)$$

As described above, the check node update rule is expressed as a product of a sign and a magnitude, where the sign is denoted by $$\prod_{n' \in N(m)\backslash n} \text{sign}(T_{n',m}^{(i)})$$

and the magnitude is denoted by $$f^{-1}\left[\sum_{n' \in N(m)\backslash n} f(|T_{n',m}^{(i)}|)\right].$$

Using Equation (4), the magnitude part of the check node update rule can be expressed as Equation (5):

$$E_{n,m}^{(i)} = -\left[\delta^{-1} \ln\left(\sum_{n' \in N(m)\backslash n} e^{-\delta|T_{n',m}^{(i)}|}\right)\right] \qquad (5)$$

In Equation (5), $E_{n,m}^{(i)}$ denotes a message delivered from an $m^{th}$ check node to an $n^{th}$ variable node, and [x] denotes an integer part of 'x'. In addition, if the quantization interval $\delta$ is ln2 ($\delta$=ln2), Equation (5) can be rewritten as Equation (6):

$$E_{n,m}^{(i)} = -\left[\log_2\left(\sum_{n' \in N(m)\backslash n} 2^{-|T_{n',m}^{(i)}|}\right)\right] \qquad (6)$$

The magnitude part in the check node update rule shown in Equation (6) increases in its error as an LLR decreases due to an approximation error of the development in MacLaurin Series shown in Equation (4). Therefore, if the error caused by the approximation error of the development in MacLaurin Series is corrected taking two constants $C_1$ and $C_2$ into account, the magnutude part in the check node update rule shown in Equation (6) can be expressed as Equation (7):

$$E_{n,m}^{(i)} = C_2 - \left[\log_2\left(\sum_{n' \in N(m)\backslash n} 2^{C_1 - 1|T_{n',m}^{(i)}|}\right)\right] \qquad (7)$$

A check node processor implemented using Equation (7) is optimized on the assumption that for all messages input to the check node processor, its quantization interval $\delta$ is uniform to ln2 ($\delta$=ln2).

Figure 3:
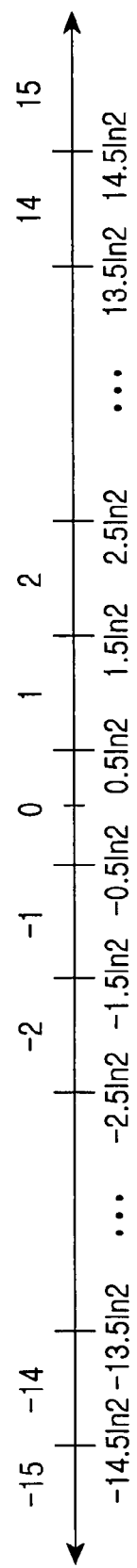
FIG. 3 is a diagram illustrating a uniform quantization operation of a uniform quantizer.

FIG. 3 is a diagram illustrating a uniform quantization operation of a uniform quantizer.

Here, the operation of the uniform quantizer is an operation of a uniform quantizer for the case where the number of quantization bits is 5 and the quantization interval $\delta$ is ln2.

Figure 4:
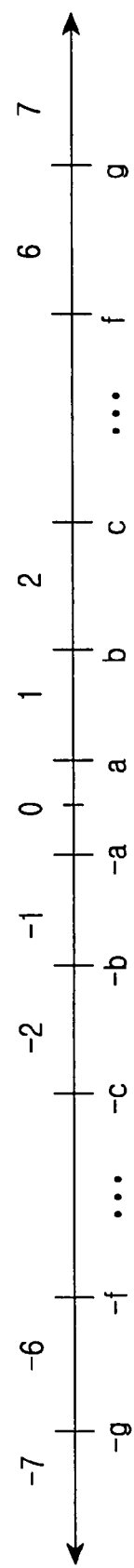
FIG. 4 is a diagram illustrating a non-uniform quantization operation of a non-uniform quantizer.

With reference to FIG. 4, a description will now be made of a non-uniform quantization operation of a non-uniform quantizer.

In this case, the operation of the non-uniform quantizer is an operation of the non-uniform quantizer for the case where the number of quantization bits is 4 and the quantization interval $\delta$ is non-uniform. The input values to the non-uniform quantizer are consecutive real number values, and they have integer output values from −7 to +7 according to a range of the input values. Herein, non-uniform quantization interval δ is shown as a, b, c, d, e, f and g, and the a, b, c, d, e, f and g are optimized so as to enhance LDPC decoding performance of the decoder.

As described above, the decoder includes a quantizer, a check node processor, and a variable node processor. The quantizer is implemented with a uniform quantizer or a non-uniform quantizer according to a quantization scheme determined by the decoder to use. The check node processor and the variable node processor are implemented to be optimized for the quantizer. For example, if the quantizer is a uniform quantizer, the check node processor and the variable node processor are implemented to be optimized for the uniform quantizer, and if the quantizer is a non-uniform quantizer, the check node processor and the variable node processor are implemented to be optimized for the non-uniform quantizer.

In the case where the number of quantization bits is greater than or equal to 5 in the communication system, use of a uniform quantizer and use of a check node processor and a variable node processor optimized for the uniform quantizer contribute to remarkable improvement of decoding performance of the LDPC code. However, in the case where the number of quantization bits is less than or equal to 4 in the communication system, use of a non-uniform quantizer and use of a check node processor and a variable node processor optimized for the non-uniform quantizer contribute to remarkable improvement of decoding performance of the LDPC code.

However, in the case where the number of quantization bits is less than or equal to 4 in the communication system, use of a uniform quantizer and use of a check node processor and a variable node processor optimized for the uniform quantizer considerably decrease decoding performance of the LDPC code. Generally, however, the decoder includes a quantizer corresponding to a quantization scheme to be used, and a check node processor and a variable node processor optimized for the quantizer. Therefore, the decoder is implemented such that decoding performance of the LDPC code is optimized only with any one of the uniform quantization scheme and the non-uniform quantization scheme.

In summary, a change in the number of quantization bits can cause a change in the quantization scheme that can improve decoding performance of the LDPC code. In this case, it is impossible to decode the LDPC code taking the change in the quantization scheme into account. Therefore, the present invention implements the decoder by taking into account even the change in the quantization scheme due to the change in the number of quantization bits so as to improve decoding performance of the LDPC code even though the number of quantization bits varies. Thus, the present invention implements the decoder to include a uniform quantizer, a non-uniform quantizer, a check node processor, and a variable node processor.

Figure 5:
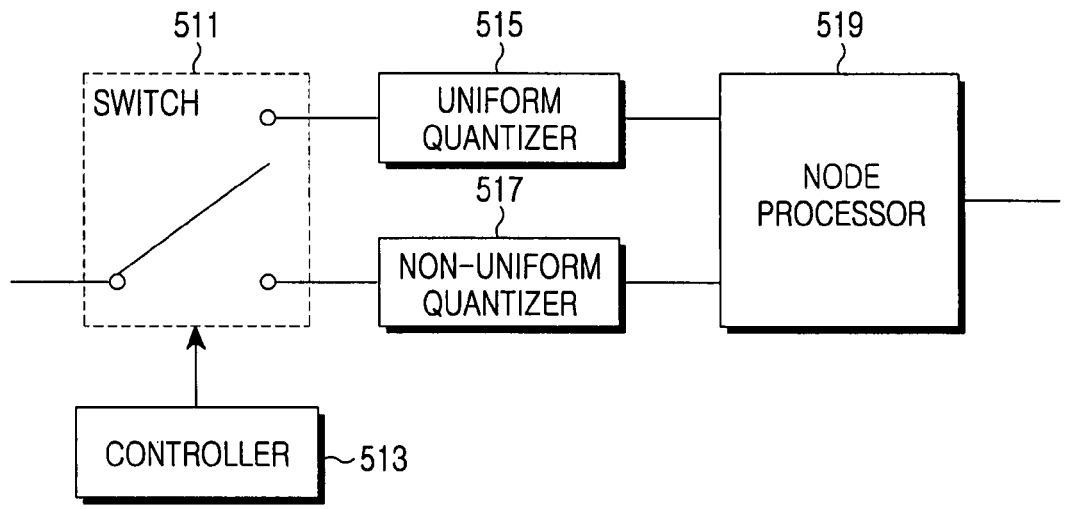
FIG. 5 is a diagram schematically illustrating an internal structure of a decoder according to the present invention.

FIG. 5 is a schematic diagram schematically illustrating an internal structure of a decoder according to the present invention.

In FIG. 5, the decoder includes a switch 511, a controller 513, a uniform quantizer 515, a non-uniform quantizer 517, and a node processor 519. The node processor 519 includes a check node processor (not shown) and a variable node processor (not shown).

In operation, if a signal is input to the decoder, the signal is delivered to the uniform quantizer 515 or the non-uniform quantizer 517 by a switching operation of the switch 511. The switch 511 performs its switching operation under the control of the controller 513. The controller 513 controls the switching operation of the switch 511 such that the signal input to the decoder is delivered to the uniform quantizer 515, for the case where the number of bits to be quantized by the decoder is greater than or equal to 5. However, the controller 513 controls an operation of the switch 511 such that the signal input to the decoder is delivered to the non-uniform quantizer 517, in the case where the number of bits to be quantized by the decoder is less than or equal to 4.

The uniform quantizer 515 quantizes the signal delivered from the switch 511 at uniform quantization intervals, and outputs the quantized signal to the node processor 519. The non-uniform quantizer 517 quantizes the signal delivered from the switch 511 at non-uniform quantization intervals, and outputs the quantized signal to the node processor 519. The node processor 519 performs corresponding node calculation on the signal output from the uniform quantizer 515 or the non-uniform quantizer 517. The node processor 519, as described above, includes a check node processor and a variable node processor, and the check node processor and the variable node processor are optimized for the case where the decoder uses the uniform quantizer 515. Check node calculations of the check node processor and variable node calculation of the variable node processor are equal to the general check node calculation and variable node calculation, so a detailed description thereof will be omitted herein.

Therefore, even though the decoder uses the check node processor and the variable node processor optimized for the uniform quantizer 515, the quantization bits are quantized using the uniform quantization scheme or the non-uniform quantization scheme according to the number of quantization bits, thereby preventing decoding performance degradation of the LDPC code.

Figure 6:
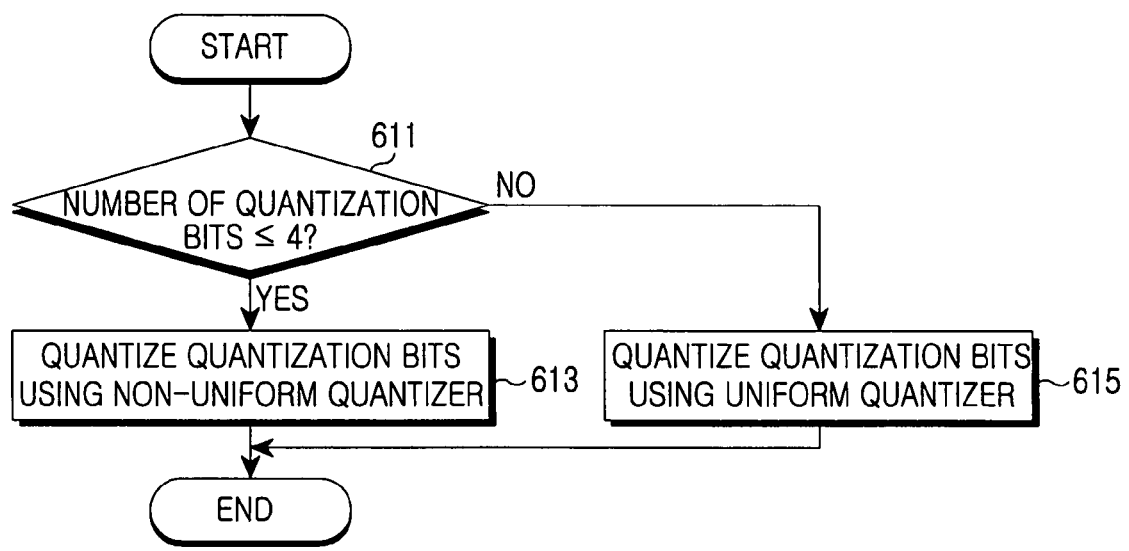
FIG. 6 is a flow diagram illustrating a quantization scheme decision operation of a decoder according to the present invention.

FIG. 6 is a flow diagram illustrating a quantization scheme decision operation of a decoder according to the present invention.

In FIG. 6, in step 611, the decoder determines whether the number of bits to be quantized by the decoder is less than or equal to 4. If it is determined that the number of bits to be quantized by the decoder is less than or equal to 4, the decoder then goes to step 613 where it determines to quantize the quantization bits using a non-uniform quantizer, and then ends the operation. However, if it is determined in step 611 that the number of bits to be quantized by the decoder is not less than or equal to 4, i.e. is greater than or equal to 5, the decoder goes to step 615 where it determines to quantize the quantization bits using a uniform quantizer, and then ends the operation.

As described above, the present invention implements a decoder for decoding an LDPC code in a communication system, such that the decoder performs variable node calculation and check node calculation using a different quantization scheme according to the number of quantization bits, thereby improving decoding performance.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for receiving a signal in a signal reception apparatus of a communication system, the method comprising:

receiving a signal;

selecting one of a uniform quantization scheme and a non-uniform quantization scheme according to a number of quantization bits;

quantizing the received signal using the selected scheme thereby generating a quantized signal; and decoding the quantized signal using a Low Density Parity Cheek (LDPC) decoding scheme.

2. The method of claim 1, wherein the decoding of the quantized signal using the LDPC decoding scheme comprises:

performing check node calculation and variable node calculation on the quantized signal.

3. The method of claim 2, wherein the selected scheme is the uniform quantization scheme when the number of quantization bits is greater than or equal to 5.

4. The method of claim 2, wherein the selected scheme is the non-uniform quantization scheme when the number of quantization bits is less than or equal to 4.

5. The method of claim 2, wherein the check node calculation and the variable node calculation optimized for the case where the selected scheme is he uniform quantization scheme.

6. An apparatus for receiving a signal in a communication system, the apparatus comprising:

a receiver for receiving a signal; and a decoder for selecting one of a uniform quantization scheme and a non-uniform quantization scheme according to a number of quantization bits, quantizing the received signal using the selected scheme thereby generating a quantized signal, and decoding the quantized signal using a Low Density Parity Check (LDPC) decoding scheme.

7. The apparatus of claim 6, wherein the decoder comprises:

a uniform quantizer for quantizing an input signal using the uniform quantization scheme;

a non-uniform quantizer for quantizing an input signal using the non-uniform quantization scheme;

a controller for controlling a switching operation according to the selected one of the uniform quantization scheme and the non-uniform quantization scheme according to the number of quantization bits, such that the input signal is input to one of the uniform quantizer and the non-uniform quantizer;

a switch for switching the input signal under the control of the controller, such that the input signal is input to one of the uniform quantizer and non-uniform quantizer; and a node processor for performing check node calculation and variable node calculation on the signal output from one of the uniform quantizer and the non-uniform quantizer.

8. The apparatus of claim 7, wherein the selected scheme is the uniform quantization scheme when the number of quantization bits is greater than or equal to 5.

9. The apparatus of claim 7, wherein the selected scheme is the non-uniform quantization scheme when the number of quantization bits is less than or equal to 4.

10. The apparatus of claim 7, wherein the node processor performs check node calculation and variable node calculation optimized for the case where the selected scheme is the uniform quantization scheme.

* * * * *